US008526541B1

(12) United States Patent
Timofeev et al.

(10) Patent No.: US 8,526,541 B1
(45) Date of Patent: *Sep. 3, 2013

(54) METHOD AND APPARATUS FOR COMPENSATING FOR DC OFFSET IN A COMMUNICATION SYSTEM

(75) Inventors: Sergey Timofeev, Santa Clara, CA (US); Atul Salhotra, Sunnyvale, CA (US); Kedar Shirali, San Jose, CA (US); Srinivasa H. Garlapati, San Ramon, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/530,285

(22) Filed: Jun. 22, 2012

Related U.S. Application Data

(63) Continuation of application No. 12/420,470, filed on Apr. 8, 2009, now Pat. No. 8,218,686.

(60) Provisional application No. 61/046,312, filed on Apr. 18, 2008.

(51) Int. Cl.
  *H04L 25/06* (2006.01)
  *H04L 25/10* (2006.01)

(52) U.S. Cl.
  USPC .......................... 375/319; 341/155; 327/307

(58) Field of Classification Search
  USPC .......................... 375/319; 341/155; 327/307
  See application file for complete search history.

(56) References Cited

U.S. PATENT DOCUMENTS

| | | | | |
|---|---|---|---|---|
| 5,764,523 A * | 6/1998 | Yoshinaga et al. | | 702/61 |
| 6,278,727 B1 * | 8/2001 | Yanagi | | 375/150 |
| 6,400,778 B1 * | 6/2002 | Matui | | 375/319 |
| 6,498,929 B1 * | 12/2002 | Tsurumi et al. | | 455/296 |
| 7,035,589 B1 * | 4/2006 | Meng et al. | | 455/63.1 |
| 7,324,609 B1 * | 1/2008 | Hwang et al. | | 375/319 |
| 7,457,374 B2 * | 11/2008 | Beyer et al. | | 375/319 |
| 7,480,234 B1 * | 1/2009 | Hart et al. | | 370/208 |
| 7,634,013 B2 | 12/2009 | Marsili | | |
| 8,218,689 B2 * | 7/2012 | Suzuki | | 375/340 |

(Continued)

OTHER PUBLICATIONS

International Standard, Information Technology—Telecommunications and Information Exchange Between Systems, Part 11: Wireless LAN Medium Access Control (MAC) and Physical Layer (PHY) Specifications, 1999, ISO/IEC 8802-11, ANSI/IEEE Std. 802.11, The Institute of Electrical and Electronic Engineers, Inc., New York, NY.

(Continued)

*Primary Examiner* — Kenneth Lam
*Assistant Examiner* — Sung Ahn

(57) ABSTRACT

An apparatus has demodulation circuitry to demodulate a radio frequency signal and produce a baseband signal, wherein the radio frequency signal comprises a periodic signal having a predetermined period. An analog-to-digital converter converts the baseband signal into a digital signal that comprises a periodic signal having the predetermined period. A first DC offset adjustment circuit estimates a DC offset contained in the digital signal based on digital samples in a sample period having a length equal to the predetermined period. A second DC offset adjustment circuit estimates the DC offset contained in the digital signal. A selection circuit selects one of the first DC offset adjustment circuit or the second DC offset adjustment circuit to be used to estimate the DC offset contained in the digital signal.

16 Claims, 6 Drawing Sheets

(56) References Cited

U.S. PATENT DOCUMENTS

| | | | |
|---|---|---|---|
| 8,279,955 B1* | 10/2012 | Zhao et al. | 375/260 |
| 2004/0229580 A1* | 11/2004 | Chen | 455/130 |
| 2005/0025041 A1* | 2/2005 | Marsili | 370/208 |
| 2005/0111525 A1* | 5/2005 | Driesen et al. | 375/147 |
| 2005/0136874 A1* | 6/2005 | Yeo et al. | 455/296 |
| 2006/0010361 A1* | 1/2006 | Lin | 714/747 |
| 2007/0242599 A1* | 10/2007 | Gorday et al. | 370/208 |
| 2007/0297536 A1* | 12/2007 | Yui et al. | 375/319 |
| 2008/0089443 A1* | 4/2008 | Sanada et al. | 375/319 |

OTHER PUBLICATIONS

International Standard, Supplement for Information Technology—Telecommunications and Information Exchange Between Systems, Part 11: Wireless LAN Medium Access Control (MAC) and Physical Layer (PHY) Specifications, High Speed Physical Layer in the 5 GHz Band, 199, ISO/IEC 8802-11, IEEE Std. 802.11a-1999, The Institute of Electrical and Electronic Engineers, Inc., New York, NY.

Supplement for Information Technology—Telecommunications and Information Exchange Between Systems, Part 11: Wireless LAN Medium Access Control (MAC) and Physical Layer (PHY) Specifications, Amendment 2: Higher-speed Physical Layer (PHY) Extension in the 2.4 GHZ Band, Nov. 7, 2001, IEEE Std. 802.11b-1999/Cor Jan. 2001, The Institute of Electrical and Electronic Engineers, Inc., New York, NY.

LAN/MAN Standards Committee of the IEEE Computer Society, Part 11: Wireless LAN Medium Access Control (MAC) and Physical Layer (PHY) Specifications: Further Higher Data Rate Extension in the 2.4 GHz Band, Apr. 2003, IEEE P802.11g/D8.2, Institute of Electrical and Electronic Engineers, Inc., New York, New York.

Mujtaba, Syed Aon, TGn Sync Proposal Technical Specification, May 18, 2005, IEEE 802.11-04/0889r6, Institute of Electrical and Electronic Engineers, Inc., New York, NY.

* cited by examiner

METHOD AND APPARATUS FOR COMPENSATING FOR DC OFFSET IN A COMMUNICATION SYSTEM

CROSS-REFERENCE TO RELATED APPLICATIONS

The present disclosure is a continuation of U.S. application Ser. No. 12/420,470, filed on Apr. 8, 2009, now U.S. Pat. No. 8,218,686 which claims the benefit of U.S. Provisional Application No. 61/046,312, filed Apr. 18, 2008, the entirety of which is hereby incorporated by reference.

FIELD

This disclosure relates generally to digital signal processing, and more particularly to techniques of compensating for DC offsets.

BACKGROUND

FIG. 1 illustrates an example of a prior art radio frequency (RF) receiver chip 10 connected to an antenna 12. In FIG. 1, the RF receiver chip 10 is comprised of a RF front end 14. The RF front end 14 comprises circuitry for receiving an RF signal 13. The RF front end 14 demodulates the RF signal 13 to produce a baseband signal 15. The baseband signal 15 is output from the RF front end 14 to an automatic gain controlled amplifier 16. The gain of the amplifier 16 is automatically adjusted, typically through a feedback loop 17, so that the baseband signal 15 is appropriately amplified to take advantage of the full dynamic range of a digital to analog converter 18. After amplification, the baseband signal 15 is input to the analog to digital converter 18 which produces a digital signal 19. The digital signal 19 is input to a baseband digital signal processor (DSP) 20 which produces output data 21. The DSP 20 has a DC offset adjustment circuit 22 at its front end. The analog to digital converter 18 may also perform a DC offset adjustment. Alternatively, a DC offset adjustment may be made prior to the analog to digital converter 18. However, after the analog to digital conversion, there may be a residual DC offset. This residual DC offset is an artifact typically present in conventional RF receiver chips and may be as much as 50 milivolts, or ten percent of the dynamic range of the analog to digital converter 18. That DC offset, coupled with carrier frequency offset (CFO), can severely degrade the performance of high-data rates which have higher order constellations. It is therefore prudent to compensate for this DC offset.

One example of a prior art circuit for dealing with DC offset compensation is illustrated in FIG. 2. The DC offset adjustment circuit 22 is comprised of a feedback loop in which a portion of the signal is multiplied by a weighting factor alpha through the use of a multiplier 26. Typically, alpha will be less than one. The weighted signal component is then input to a summer 28, the output of which is input to a delay circuit 29. The output of the delay circuit 29 is fed back to the summer 28. The combination of the multiplier 26, summer 28, and delay circuit 29 acts as an estimator 31 which, over time, averages the signal to produce an estimate of the DC offset. That estimate of the DC offset is then input to a summer 32 so as to be subtracted or removed from the signal produced by the analog to digital converter circuit 18.

In operation, by making alpha large (i.e., close to 1), more weight is placed on the current sample value and less weight is placed on the average value. Conversely, by making alpha small (i.e., close to 0) less weight is placed on the current sample value and more weight placed on the average value. Typically, alpha is close to zero such that the estimator 31 needs time to accumulate a number of samples to produce a reasonable estimate of the DC offset. Thus, the DC offset adjustment circuit 22 illustrated in FIG. 2 works well if the DC offset is low or if there is sufficient time to estimate the DC offset. For example, in the case of an 802.11b preamble, there is sufficient time (approximately 150 to 200 microseconds) to estimate the DC offset. However, if the DC offset has to be estimated quickly, the DC offset adjustment circuit 22 illustrated in FIG. 2 will not have sufficient time to produce an accurate estimate of the DC offset.

An example of a situation in which the DC offset adjustment circuit 22 illustrated in FIG. 2 will not have sufficient time to produce an accurate estimate of the DC offset can be found in certain communication schemes which fall within the 802.11 standard. In the case of an information packet in conformance with 802.11a/g/n, the preamble will be on the order of eight microseconds. FIG. 3 illustrates a short training field (STF) within a preamble of an 802.11 a/g/n compliant information packet. The short training field comprises ten equal time periods, which are each 0.8 microseconds in length. The short training field is used for presence detection, synchronization, gain setting, and coarse carrier frequency offset calculation. The entire short training field, at eight microseconds in length, is substantially shorter than the approximately 150 to 200 microseconds of an 802.11b preamble.

SUMMARY

A disclosed apparatus comprises front end circuitry to demodulate a radio frequency signal and to produce a baseband signal, the radio frequency signal comprising a periodic signal with a predetermined period. An analog-to-digital converter converts the baseband signal into a digital signal, the digital signal comprising a periodic signal with the predetermined period. A first DC offset adjustment circuit includes a filter for estimating a DC offset contained in the digital signal based only on digital samples in a sample period having a length equal to the predetermined period. An adder removes the estimated DC offset from the digital signal.

A disclosed method comprises demodulating a radio frequency signal and producing a baseband signal, the radio frequency signal comprising a periodic signal with a predetermined period. The baseband signal is converted into a digital signal, the digital signal comprising a periodic signal with the predetermined period. A DC offset contained in the digital signal is estimated based only on digital samples in a sample period having a length equal to the predetermined period. The estimated DC offset is removed from the digital signal.

BRIEF DESCRIPTION OF THE DRAWINGS

For the present disclosure to be easily understood and readily practiced, the present disclosure will now be described, for purposes of illustration and not limitation, in conjunction with the following figures.

DETAILED DESCRIPTION

Figure 2:
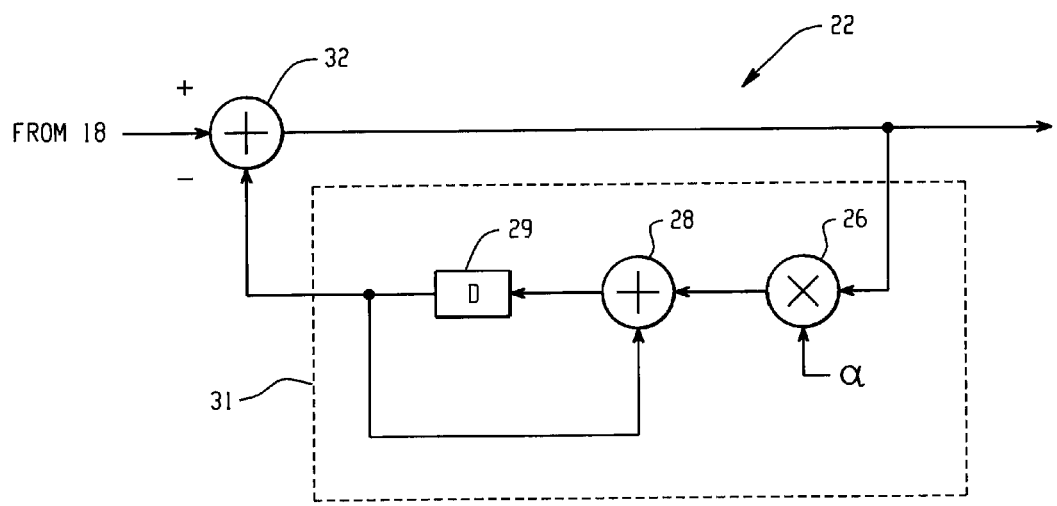
FIG. 2 is a block diagram of a prior art circuit for DC offset adjustment.

The disclosed DC compensation method and apparatus is advantageous over the conventional method and apparatus illustrated in FIG. 2, for example, in situations where the transmitted signal is zero-mean periodic by design. The disclosed method and apparatus are designed to be used, for example, in 802.11g/n systems, where a preamble structure is zero-mean periodic. In situations where the signal is not zero-mean periodic, the disclosed method and apparatus, however, are still functional. In the context of our 802.11 design, wherein the DC compensation block is shared by 802.11g/n and 802.11b communication schemes, dynamic switching between the prior art circuit and the disclosed circuit can be performed as will be described more fully herein below.

Figure 3:
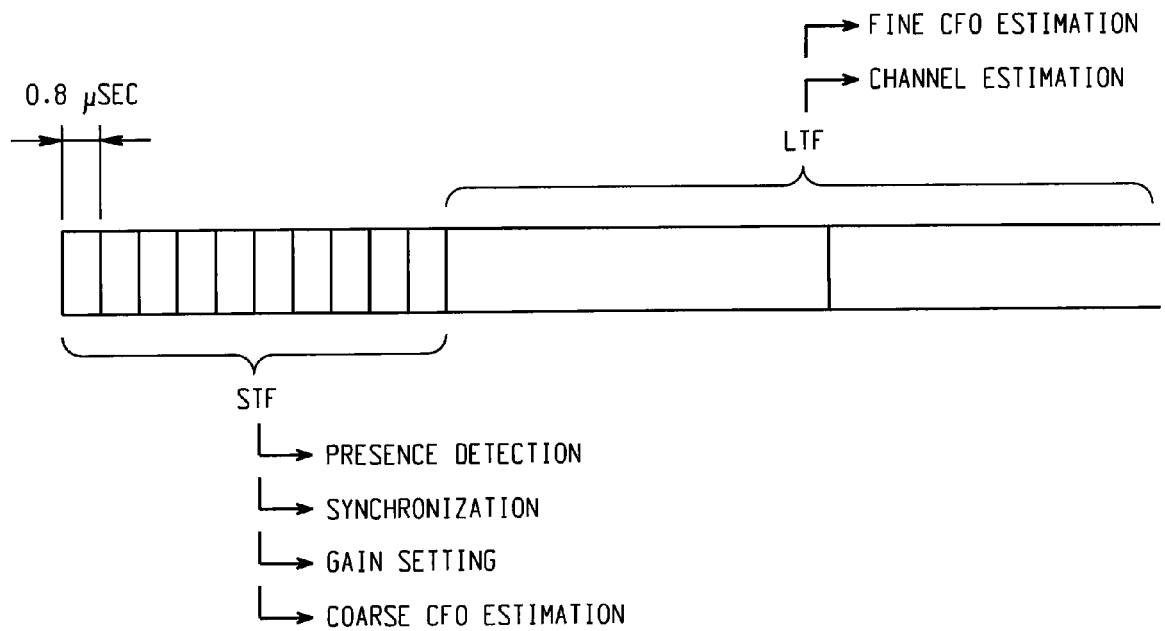
FIG. 3 is a diagram illustrating a portion of a signal packet.
Figure 4:
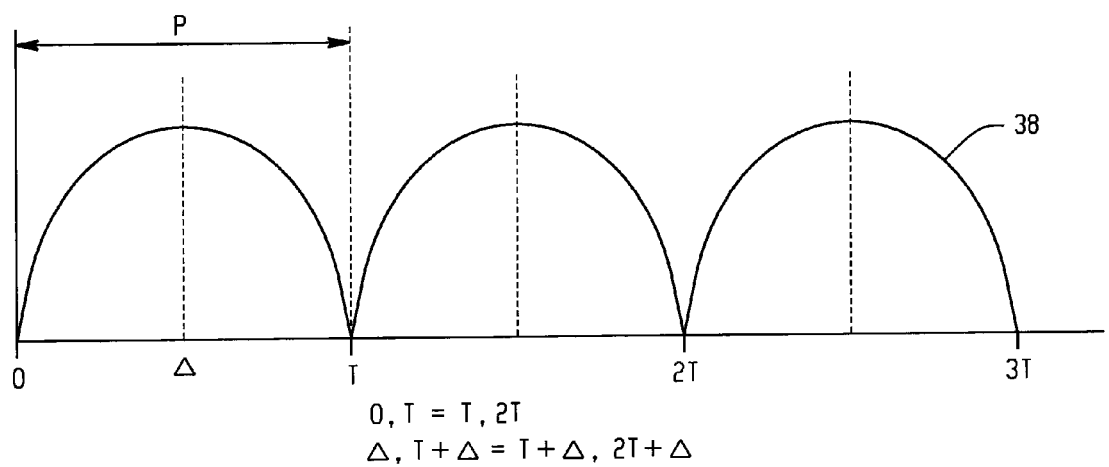
FIG. 4 is an example of a transmitted signal that is zero-mean periodic.

FIG. 4 illustrates a transmitted waveform 38 that is zero-mean periodic with a period of P. After going through a linear time invariant channel, the zero-mean periodic property is preserved. Therefore, after reception, conversion to baseband, amplification, and conversion to a digital signal, the digital signal will be zero-mean periodic. If the received signal is filtered by a moving average of length P, the filter cancels the transmitted signal completely so the output of the filter will be a DC value plus filtered noise. For example, in FIG. 4, the signal over the time period 0 to T is equal to the signal value over the time period T to 2T. Now it can be seen that any sample period of length P will suffice for taking the average. This average, which is the DC estimate plus filtered noise, may be smoothed out by applying a low pass filter to remove any high-frequency transients or artifacts from the DC estimate. The phrase low pass filter is intended to include notch filters, band-pass filters, tuned filters, among others, which are designed to pass DC and low frequencies and block higher frequencies. The timing for DC estimation is discussed in greater detail in conjunction with FIGS. 8-10. However, if filtering of the received signal begins immediately upon receipt of the preamble, the first P−1 samples are discarded (in one implementation) because of various transient signals. In the context of an 802.11g/n preamble shown in FIG. 3, because the preamble is 8 microseconds in length, and is divided into 10 equal periods, the sample period P for such a signal is 0.8 microseconds.

Figure 1:
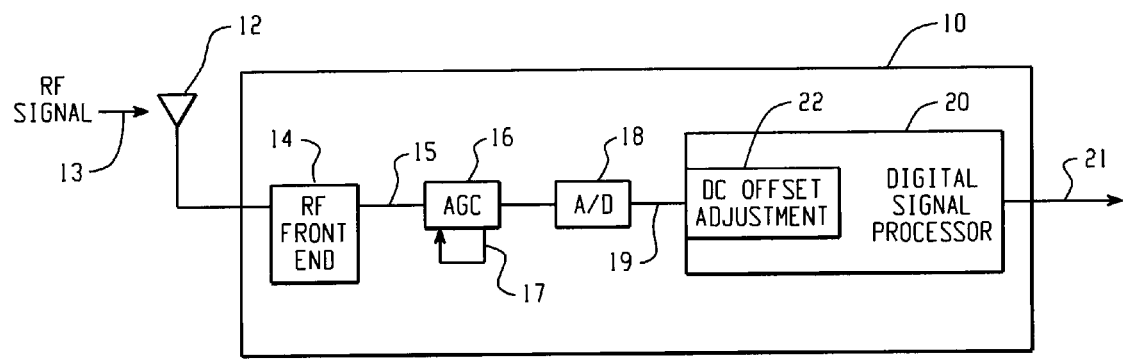
FIG. 1 is a high-level block diagram of a prior art radio frequency receiver chip connected to an antenna.
Figure 5A:
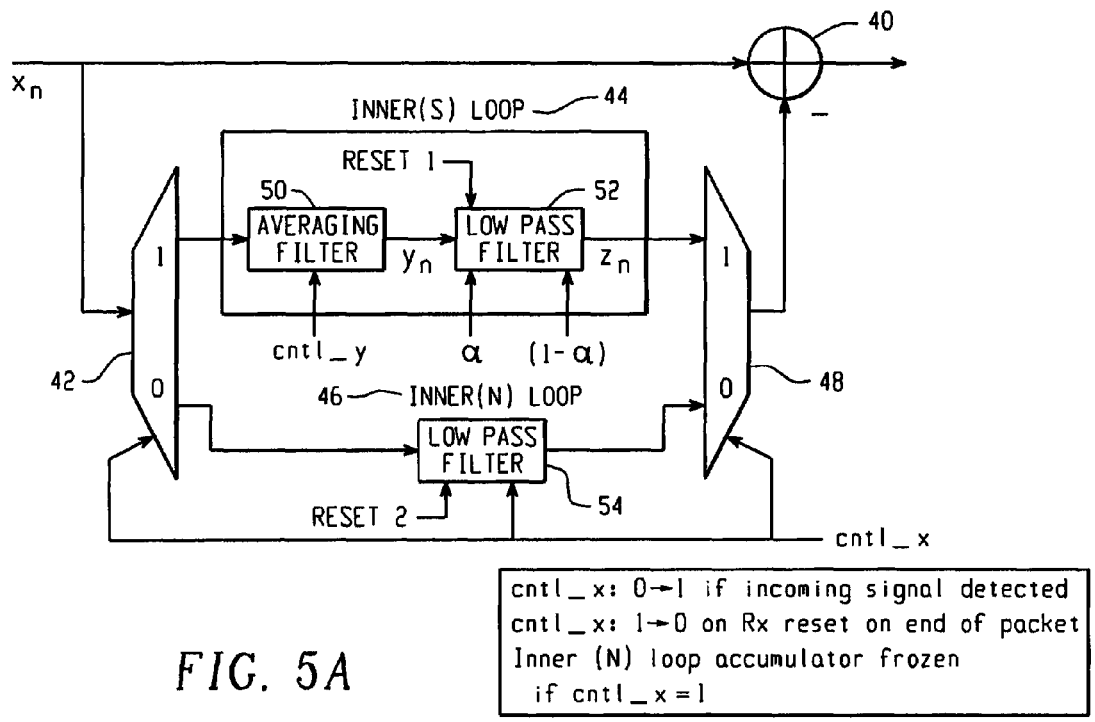
FIG. 5A is a block diagram illustrating the DC offset circuit of the present disclosure.
Figure 5B:
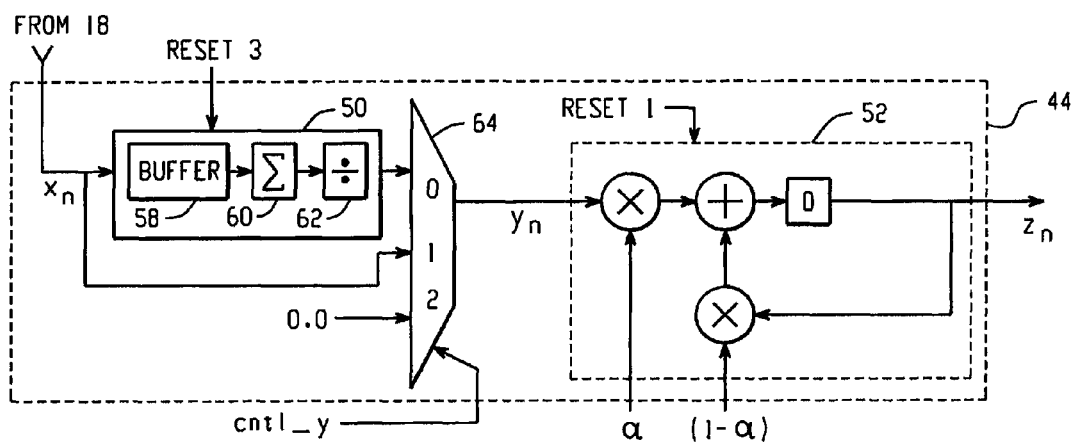
FIG. 5B is a block diagram illustrating the components of the inner (s) loop shown in FIG. 5A.

FIGS. 5A and 5B illustrate exemplary implementations of the disclosed method and apparatus. However, other implementations are possible. In FIG. 5A, the reference $x_n$ represents the output of the analog to digital converter 18 of FIG. 1.

The output $x_n$ of the analog to digital converter 18 is provided to an adder 40 and a multiplexer 42. The multiplexer 42 is controlled by a control signal cntl_x produced by the DSP 20. In one implementation, the multiplexer 42 passes the output $x_n$ to a first inner loop (path) 44 or a second inner loop 46. A multiplexer 48 passes either the output from the first inner loop 44 or the output from the second inner loop 46 to the adder 40 under control of the control signal cntl_x.

The first inner loop 44 comprises an averaging filter 50 in series with a low pass filter 52. The averaging filter 50 is discussed in detail in conjunction with FIG. 5B. The low pass filter 52 may be constructed according to the prior art as shown in FIG. 2. The greater weighting factor (1−α) is multiplied with the signal output from delay element 29 (see FIG. 2) and input to Summer 28. The second inner loop 46 comprises a low pass filter 54 which may also be constructed according to the prior art as shown in FIG. 2. In one implementation, the low pass filter 52 has different alpha values relative to those of the low pass filter 54. The averaging filter 50 may receive the control signal cntl_y while the low pass filter 54 may receive the control signal cntl_x, both of which are produced (in one implementation) by the DSP 20.

Details of the first inner loop 44 are illustrated in FIG. 5B. In one implementation, the averaging filter 50 comprises a buffer 58, a summer (or adder) 60, and a divider 62 which may be implemented by a counter. In operation, the averaging filter 50 buffers samples of the signal, sums a group of samples over a sample period of length T, and divides the result by the number of samples. Mathematically, the output $y_n$ of the averaging filter 50 may be represented by the following equation:

$$y_n = \frac{1}{P} \sum_{i=n}^{n-P+1} x_i$$

The output $z_n$ of the low pass filter 52 may be represented by the following equation:

$$z_n = \alpha y_n + (1-\alpha) z_{n-1}$$

The equations represent the hardware illustrated in FIG. 5B. Other hardware could be used, for example, to implement the following function for the averaging filter 50:

$$y_n' = y_{n-1}' + x_n - x_{n-P}$$

$$y_n = \frac{1}{P} y_n'$$

These two equations are equivalent to the equation for $y_n$ above and are thus an alternative implementation.

Completing the description of the apparatus shown in FIG. 5B, a multiplexer 64 receives three signals—the output of the averaging filter 50, the output of the analog to digital converter 18, or a value of zero. The multiplexer 64 is under control of the control signal cntl_y.

In operation, the apparatus of FIG. 5B implements a method of removing a DC offset from a received transmitted radio frequency signal that has been converted to a baseband signal, amplified by a circuit having a gain that is automatically adjusted, and converted into a digital signal. The digital signal in some applications can be a zero-mean periodic signal and can have a preamble that is less than 10 microseconds in length. The averaging filter 50 dynamically receives the output of the analog to digital converter 18 when the digital signal has a preamble that is less than 10 microseconds in length. The averaging filter 50 calculates one or more averages during at least a portion of the preamble over one or more sample periods each of length P, where P is the period of the preamble. The multiplexer 64 can be controlled to pass the output of the analog to digital converter 18 directly to the low pass filter 52, and thereby dynamically bypass the averaging filter 50. The output of the low pass filter 52 can be provided to the adder 40 so that the estimate of the DC offset, however calculated, is subtracted from the signal $x_n$. Thus, the first inner loop 44 may be used to perform DC estimation without use of the second inner loop 46.

Turning now to the operation of the apparatus illustrated in FIG. 5A, that apparatus implements a method of removing a DC offset from a received radio frequency signal. In one implementation, the received radio frequency signal corresponds to a signal that has been converted to a baseband signal, amplified by a circuit having a gain that is automatically adjusted, and converted into a digital signal. The method includes selecting the first inner loop 44 during packet reception and selecting the second inner loop 46 during interpacket reception times. The selection is performed using the multiplexers 42, 48. The output of the selected loop is input to adder 40 so that the DC estimate, however calculated, can be removed from the signal $x_n$. The inner loop 44 in the embodiment of FIG. 5A implements the method which has been previously described in conjunction with FIG. 5B and will therefore not be repeated. The multiplexers 42, 48, 64 operate as switches and, in general, other types of hardware may be used to implement the switching functions of multiplexers 42, 48, 64.

In one implementation, the accumulator of the first inner loop 44 is reset to zero at the end of every packet by a Reset 1 signal produced by the DSP 20. The accumulator of the inner loop 46 is reset to zero upon system reset by a Reset 2 signal produced by the DSP 20. The averaging filter 50 is reset when cntl_x switches from 0 to 1 by a Reset 3 signal which is also produced by the DSP 20.

Figure 6A:
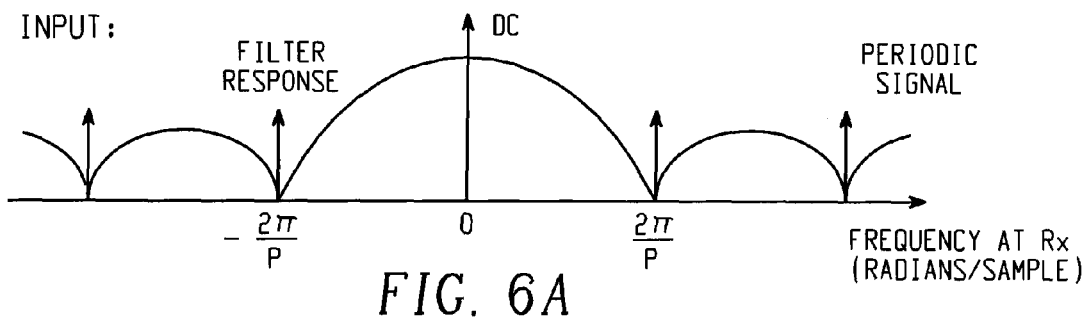
FIGS. 6A and 6B illustrate the input and output, respectively, of a filter when there is no carrier frequency offset (CFO).
Figure 6B:
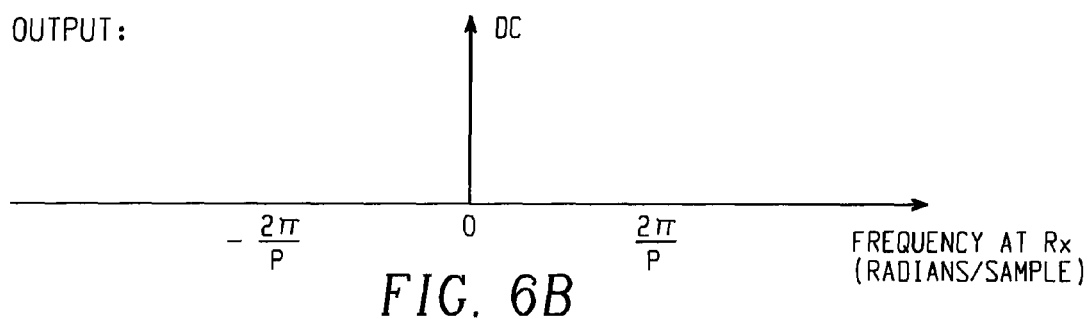
Figure 7A:
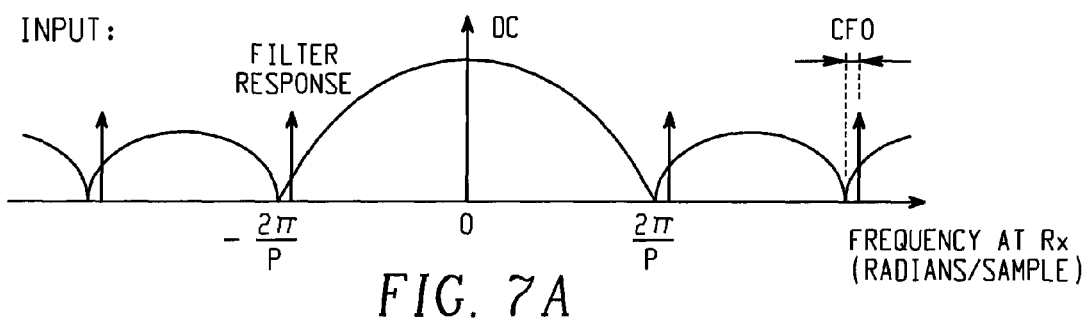
FIGS. 7A and 7B illustrate the input and output, respectively, of a filter when there is carrier frequency offset (CFO).
Figure 7B:
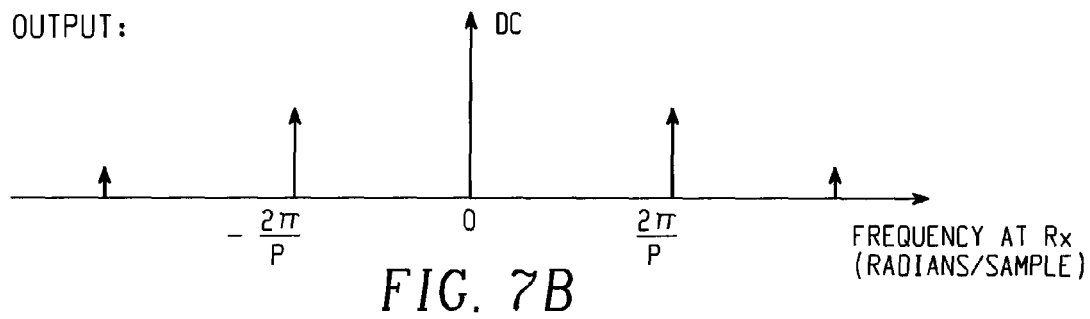

As previously mentioned, in one implementation, the disclosed DC offset method and apparatus operate in conjunction with a zero-mean periodic signal. Carrier frequency offset (CFO), i.e., the mismatch in frequencies between the transmitter and receiver, causes the signal to be non-periodic. For example, if both transmitter and receiver frequencies deviate from nominal by as much as +/−50 kHz, the carrier frequency offset can be as high as +/−100 kHz. FIGS. 6A and 6B illustrate a periodic signal with no carrier frequency offset. Under these ideal circumstances, the filter response at all frequencies except zero (i.e., DC) cancel out. FIGS. 7A and 7B illustrate the same situation but with a carrier frequency offset. It is seen that now the filter response at all frequencies does not exactly cancel out. Under these circumstances, the low pass filter 52 improves the output of the averaging filter 50 by attenuating those frequencies outside the notch of the filter.

The operation of the first inner loop 44 is effective when the input is a legacy short training field (L-STF) or a high throughput short training field (HT-STF). In one implementation, the gain of the automatic gain controlled amplifier 16 is fixed before the first inner loop 44 is turned on or the samples produced during that period discarded. The first inner loop 44 may be kept off by setting alpha to zero or the first inner loop 44 may be kept in a tracking mode by setting alpha to a very small value. The values of alpha, and the times when the values of alpha are changed, are controlled by the DSP 20.

Figure 8:
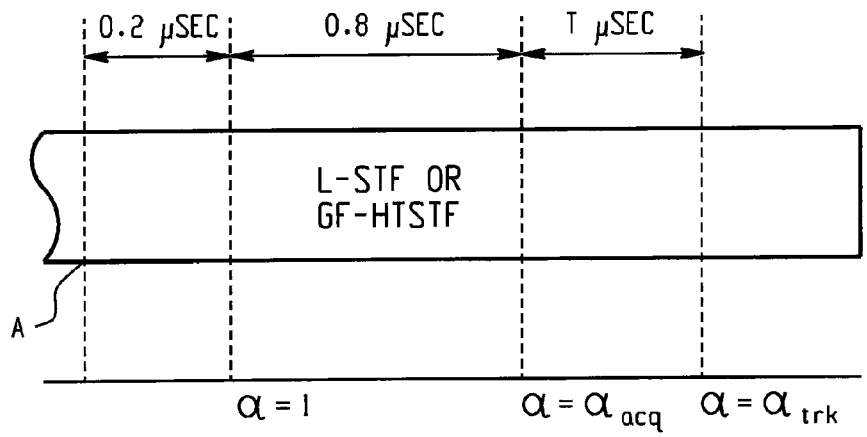
FIG. 8 illustrates the operation of the disclosed DC offset method in conjunction with an L-STF for mixed mode/legacy or HT-STF for Greenfield packets.

Turning to FIG. 8, a portion of the message package is illustrated. Specifically, a portion of an L-STF or Greenfield-HTSTF is illustrated. In FIG. 8, point A represents the time at which the gain of the automatic gain controlled amplifier 16 is fixed. The 0.2 microsecond period is the time for the last gain change (before the gain is fixed) to propagate through the analog to digital converter 18. Suggested exemplary values are as follows:

$\alpha_{acq}=1/32$, $\alpha_{trk}=1/2048$, $T=0.4$ μsec

The time period of 0.8 microseconds is the sample period of length P. The time period of T microseconds is the time needed for the low pass filter 52 to operate. Note that because symbol timing is not available at this point in the process, in one implementation, the time at which the gain is fixed can be used as a reference for calculating the switching times for alpha. The operation of the automatic gain controlled amplifier 16 should guarantee that [time needed to fix the gain+T+1 microsecond] is still well within the 8 microseconds of the LSTF/HTSTF preamble.

Figure 9:
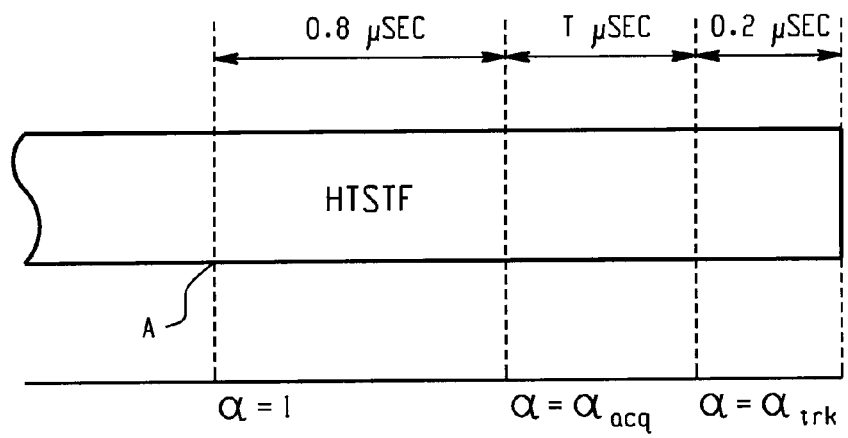
FIG. 9 illustrates the operation of the disclosed DC offset method in conjunction with an HT-STF for mixed mode packets.

FIG. 9 illustrates the switching of the value of alpha for a HTSTF of mixed mode packets. In FIG. 9, point A represents the time at which the logic must guarantee that the gain is fixed and all transients settled. The 0.8 microsecond period represents the sample period P. The period of T microseconds again represents the operation of the low pass filter 52. Under these circumstances, exemplary values for alpha are as follows:

$\alpha_{acq}=1/32$, $\alpha_{trk}=1/2048$, $T=0.4$ μsec

Note that in the circumstances of FIG. 9, this training field is in the middle of the packet. Under those circumstances, symbol timing is available, so we use the end of the HTSTF as a reference for calculating the switching times for alpha.

Figure 10:
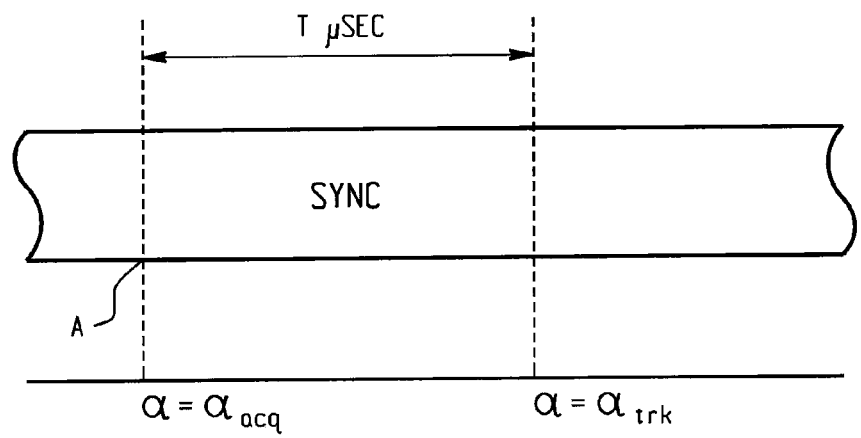
FIG. 10 illustrates the operation of the disclosed DC offset method in conjunction with 802.11b packets.

FIG. 10 represents the operation of the present invention in connection with an 802.11b packet. In the context of FIG. 10, point A represents the time at which the gain is fixed and signal detection has occurred. Suggested exemplary values for alpha are as follows:

$\alpha_{acq}=1/256$, $\alpha_{trk}=1/8192$, $T=20$ μsec

We now describe some DC offset estimation error statistics derived in conjunction with the disclosed method and apparatus. The first two tables estimate DC offset values for a 20 MHz signal, 50 mV DC offset, with a carrier frequency offset of 100 kHz and 50 kHz, respectively.

TABLE 1

| SNR (dB) | Mean (mV) | Standard deviation (mV) | Min (mV) | Max (mV) |
|---|---|---|---|---|
| 20 | −0.1 | 3.7 | −9.5 | 8.9 |
| 30 | −0.26 | 2.3 | −6.5 | 5.84 |
| 40 | −0.2 | 2.1 | −5.4 | 4.8 |

TABLE 2

| SNR (dB) | Mean (mV) | Standard deviation (mV) | Min (mV) | Max (mV) |
|---|---|---|---|---|
| 20 | −0.6 | 3.2 | −9.2 | 8.5 |
| 30 | −0.4 | 1.42 | −4.4 | 3.0 |
| 40 | −0.5 | 1.05 | −3.1 | 2.1 |

These tables illustrate that for a 20 kHz signal, the higher the carrier frequency offset, the less reliable the DC estimate becomes.

The next two tables estimate DC offset values for a 40 MHz signal, 50 mV DC offset, with a carrier frequency offset of 100 kHz and 200 kHz, respectively

TABLE 3

| SNR (dB) | Mean (mV) | Standard deviation (mV) | Min (mV) | Max (mV) |
|---|---|---|---|---|
| 20 | −0.2 | 2.8 | −10.0 | 7.2 |
| 30 | −0.27 | 1.4 | −4.7 | 4.8 |
| 40 | −0.4 | 1.2 | −4.1 | 2.9 |

TABLE 4

| SNR (dB) | Mean (mV) | Standard deviation (mV) | Min (mV) | Max (mV) |
|---|---|---|---|---|
| 20 | −0.3 | 3.3 | −9.2 | 9.7 |
| 30 | −0.4 | 2.4 | −6.9 | 5.9 |
| 40 | −0.3 | 2.2 | −6.3 | 5.2 |

We see from these two tables that for 40 MHz signals, the DC estimation is not as sensitive to carrier frequency offset likely because the side lobes are further removed from the DC center and more easily filtered out by the low pass filter 52 thus improving the result.

The final two tables provide an estimation of quality for situations where the signal to noise ratio (SNR) is low. Table 5 provides estimated error statistics using an Orthogonal Frequency Division Multiplexing (OFDM) scheme, with 0 mV DC offset, Additive White Gaussian Noise (AWGN), and an SNR of 5 dB. Table 6 is the same, but with an SNR of 10 dB.

TABLE 5

| BW and CFO | Mean (mV) | Standard deviation (mV) | Min (mV) | Max (mV) |
|---|---|---|---|---|
| 20 MHz, 50 kHz | −0.3 | 3.7 | −11.2 | 12.3 |
| 20 MHz, 100 kHz | −0.17 | 3.6 | −12.1 | 11.2 |
| 40 MHz, 100 kHz | −0.1 | 3.0 | −7.6 | 11.1 |
| 40 MHz, 200 kHz | 0.04 | 3.1 | −8.2 | 9.6 |

TABLE 6

| BW and CFO | Mean (mV) | Standard deviation (mV) | Min (mV) | Max (mV) |
|---|---|---|---|---|
| 20 MHz, 50 kHz | −0.3 | 3.6 | −13.1 | 9.0 |
| 20 MHz, 100 kHz | −0.3 | 3.6 | −10.0 | 11.5 |
| 40 MHz, 100 kHz | 0.1 | 3.1 | −9.1 | 11.6 |
| 40 MHz, 200 kHz | 0.2 | 3.1 | −9.6 | 11.9 |

Figure 11:
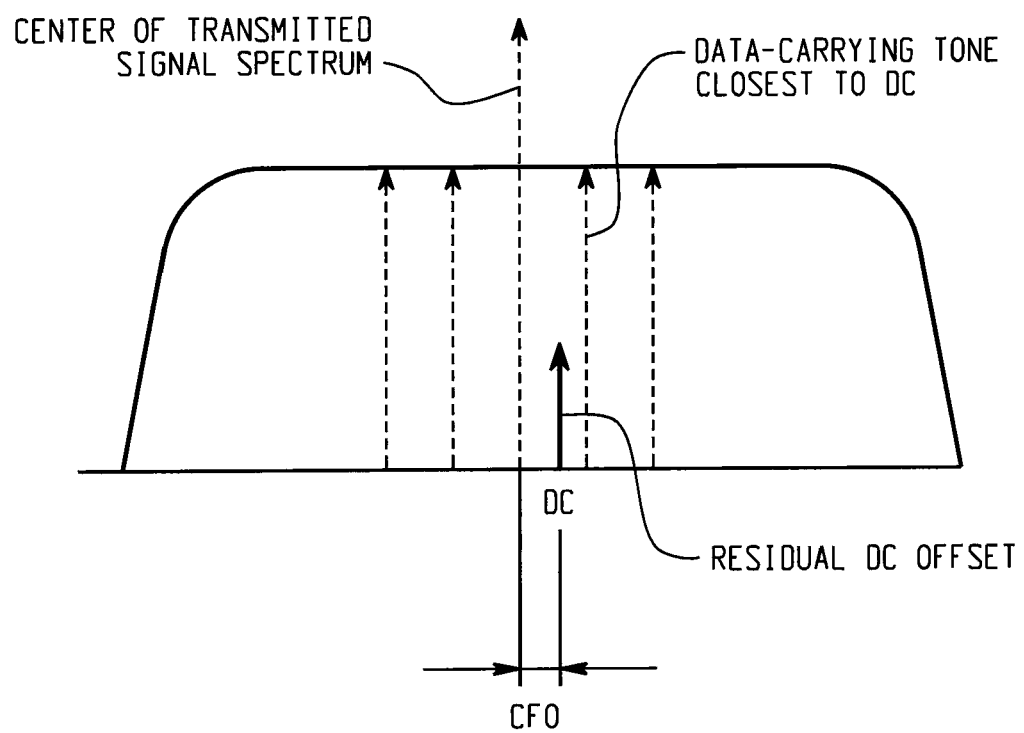
FIG. 11 illustrates the nulling of the most affected data tone to improve performance.

When carrier frequency offset is large, the estimation error of the DC offset is higher. Additionally, in an OFDM system, high carrier frequency offset will result in residual DC offset being very close in frequency to one of the data-carrying tones adjacent to the center of the transmitted spectrum (on the positive or negative side, depending on the sign of the carrier frequency offset). As a result, the data on that tone is very likely to be corrupted by the residual DC offset. This is shown in FIG. 11. An accurate estimate of the carrier frequency offset is available after LTF of the packet has been processed, before data decoding (see FIG. 3). Therefore before data processing has begun, carrier frequency offset estimate provides information on whether the data tone closest to DC is likely to be corrupted. Because 802.11a/g/n uses channel coding across data tones, it is possible to recover all the data if one of the tones is skipped. Because it is known which exact tone will be most affected by the DC offset, that specific tone can be skipped, or nulled. One way to null a tone, or force the decoder to ignore it, is by setting to zero the FFT output and channel estimate corresponding to this tone's location. The circuitry required is a simple multiplexer which overwrites the FFT output and channel estimation registers with zero, and multiplexer control, which is comparison logic to determine if carrier frequency offset is too high.

The disclosed DC estimation method and apparatus represents an improvement over the prior art shown, for example, in FIG. 2. The disclosed method and apparatus's superiority can be exploited in a packet-based communication system, where a part of the preamble is zero-mean periodic by design. An example of such a system is the 802.11a/g/n schemes. The estimation accuracy of the disclosed method and apparatus does not depend on the DC level which is present. The estimation accuracy of the proposed scheme suffers at high values of carrier frequency offset. To reduce the resulting performance loss in OFDM systems, we propose a data tone nulling method.

Although the present disclosure describes a method and apparatus in terms of one or more embodiments, many modifications and variations are possible. For example, one or more steps of methods described above may be performed in a different order and still achieve desirable results. The following claims are intended to encompass all such modifications and variations.

What is claimed is:

1. An apparatus comprising:
    demodulation circuitry configured to demodulate a radio frequency signal and produce a baseband signal, wherein the radio frequency signal comprises a periodic signal having a predetermined period;
    an analog-to-digital converter to convert the baseband signal into a digital signal, wherein the digital signal comprises a periodic signal having the predetermined period;
    a first DC offset adjustment circuit configured to estimate a DC offset contained in the digital signal based on digital samples in a sample period having a length equal to the predetermined period;
    a second DC offset adjustment circuit configured to estimate the DC offset contained in the digital signal;
    a selection circuit configured to select one of the first DC offset adjustment circuit or the second DC offset adjustment circuit to be used to estimate the DC offset contained in the digital signal; and
    a circuit for removing the estimated DC offset from the digital signal in accordance with one of the first DC offset adjustment circuit or the second DC offset adjustment circuit as selected by the selection circuit.

2. The apparatus of claim 1, wherein the selection circuit selects the first DC offset adjustment circuit during periods of packet reception and selects the second DC offset adjustment circuit during periods of interpacket reception.

3. The apparatus of claim 1, further comprising an amplifier configured to amplify the radio frequency signal prior to the analog-to-digital signal converting the radio frequency signal into the digital signal.

4. The apparatus of claim 3, wherein a gain of the amplifier is fixed prior to estimating the DC offset contained in the digital signal.

5. The apparatus of claim 1, wherein the first DC offset adjustment circuit further include a filter to estimate the DC offset and a low pass filter to remove any high-frequency transients or artifacts from the estimated DC offset.

6. The apparatus of claim 1, wherein the radio frequency signal comprises an information packet having a preamble, the preamble being of a predetermined length and being zero-mean periodic with the predetermined period.

7. The apparatus of claim 6, wherein the information packet is in conformance with one or more of 802.11a, 802.11g, or 802.11n standards.

8. The apparatus of claim 6, wherein the predetermined length of the preamble is less than ten microseconds.

9. The apparatus of claim 1, wherein the second DC offset adjustment circuit comprises a feedback loop to estimate the DC offset contained in the digital signal.

10. A method comprising:
demodulating a radio frequency signal and producing a baseband signal, wherein the radio frequency signal comprises a periodic signal having a predetermined period;
converting the baseband signal into a digital signal, wherein the digital signal comprises a periodic signal having the predetermined period;
selecting a first DC offset adjustment circuit or a second DC offset adjustment circuit to estimate a DC offset contained in the digital signal, wherein
if the first DC offset adjustment circuit is selected, then using the first DC offset adjustment circuit to estimate a DC offset contained in the digital signal based on digital samples in a sample period having a length equal to the predetermined period, and
if the second DC offset adjustment circuit is selected, then using the second DC offset adjustment circuit to estimate the DC offset contained in the digital signal; and
removing the estimated DC offset from the digital signal.

11. The method of claim 10, wherein:
the first DC offset adjustment circuit is selected during periods of packet reception; and
the second DC offset adjustment circuit is selected during periods of interpacket reception.

12. The method of claim 10, further comprising amplifying the radio frequency signal prior to converting the radio frequency signal into the digital signal.

13. The method of claim 10, further comprising removing any high-frequency transients or artifacts from the estimated DC offset.

14. The method of claim 10, wherein the radio frequency signal comprises an information packet having a preamble, the preamble being of a predetermined length and being zero-mean periodic with the predetermined period.

15. The method of claim 14, wherein the information packet is in conformance with one or more of 802.11a, 802.11g, or 802.11n standards.

16. The method of claim 14, wherein the predetermined length of the preamble is less than ten microseconds.

* * * * *